United States Patent
Arafat et al.

(10) Patent No.: US 12,273,056 B2
(45) Date of Patent: Apr. 8, 2025

(54) FAULT DETECTION SYSTEM FOR MULTIPHASE MACHINES

(71) Applicant: Cummins Inc., Columbus, IN (US)

(72) Inventors: Akm Arafat, Blaine, MN (US);
Bradford K. Palmer, Ham Lake, MN (US); Dakshina S. Murthy-Bellur, Plymouth, MN (US)

(73) Assignee: Cummin Inc., Columbus, IN (US)

( * ) Notice: Subject to any disclaimer, the term of this patent is extended or adjusted under 35 U.S.C. 154(b) by 120 days.

(21) Appl. No.: 18/023,148

(22) PCT Filed: Sep. 1, 2021

(86) PCT No.: PCT/US2021/048593
§ 371 (c)(1),
(2) Date: Feb. 24, 2023

(87) PCT Pub. No.: WO2022/051320
PCT Pub. Date: Mar. 10, 2022

(65) Prior Publication Data
US 2023/0344377 A1    Oct. 26, 2023

Related U.S. Application Data

(60) Provisional application No. 63/074,098, filed on Sep. 3, 2020.

(51) Int. Cl.
*H02P 25/22*    (2006.01)
*G01R 31/34*    (2020.01)
*H02P 29/024*   (2016.01)

(52) U.S. Cl.
CPC .......... *H02P 25/22* (2013.01); *H02P 29/0243* (2016.02); *G01R 31/343* (2013.01)

(58) Field of Classification Search
CPC .. H02P 29/0243; H02P 25/22; H02P 2207/01; H02P 29/0241; G01R 31/346; H02H 3/253; H02J 3/26
See application file for complete search history.

(56) References Cited

U.S. PATENT DOCUMENTS 5,270,640 A      12/1993  Kohler
6,064,172 A  *   5/2000   Kuznetsov ........... G01R 31/346
                                                318/434

(Continued)

OTHER PUBLICATIONS

International Search Report and Written Opinion for International patent application No. PCT/US2021/048593, filed Sep. 1, 2021, mailed Nov. 23, 2021.

*Primary Examiner* — Antony M Paul
(74) *Attorney, Agent, or Firm* — Faegre Drinker Biddle & Reath LLP

(57) ABSTRACT

A method for operating a processing system to identify faults in an electric machine system including a multiphase machine having plurality of sets of windings; comprising: receiving parameter information representative of electrical operating parameters of the multiple phases of each of the multiple winding sets of the multiphase machine; determining symmetrical components based on the parameter information; comparing the symmetrical components to fault information defining faults of the multiple phases of the multiple winding sets with respect to symmetrical component fault values; identifying faults in one or more of the multiple phases of the multiple winding sets based on the comparison.

12 Claims, 4 Drawing Sheets

(56) References Cited

U.S. PATENT DOCUMENTS

| | | |
|---|---|---|
| 7,592,772 B2 | 9/2009 | Nandi |
| 8,867,181 B2 | 10/2014 | Hasan |
| 2014/0117912 A1* | 5/2014 | Gajic ........................ H02H 7/06 |
| | | 318/490 |
| 2015/0276880 A1* | 10/2015 | Sharma .............. G01R 19/0046 |
| | | 702/58 |

* cited by examiner

FAULT DETECTION SYSTEM FOR MULTIPHASE MACHINES

CROSS-REFERENCE TO RELATED APPLICATIONS

This application is a national stage of and claims priority to International Patent Application No. PCT/US2021/048593, filed Sep. 1, 2021, which claims priority to U.S. Provisional Patent Application No. 63/074,098, filed Sep. 3, 2020, the subject matter of both of which are incorporated herein by reference in their entirety.

FIELD

This disclosure relates generally to fault tolerant control systems for multiphase machines. Disclosed embodiments include methods and apparatus for detecting faults in six-phase interior type permanent magnet machines.

BACKGROUND

Multiphase alternating current (AC) machines such as motor systems are used in a wide variety of applications including industrial settings and motor vehicles. Motor systems of these types include an AC motor, inverter and motor control system. In response to an input command, the motor control system causes the inverter to apply power from an energy source to the motor in a controlled manner, and causes the motor to provide the commanded output. For example, in response to a torque command, the motor control system will cause the motor to deliver the requested torque at the motor output shaft.

Multiphase machines of these types exhibit fault tolerance capability. For example, certain multiphase machines may be operated under open phase faults at one or multiple phases. However, to effectively activate fault tolerance capabilities it is desirable to identify the faults.

There remains a continuing need for systems and methods capable of accurately identifying faults in multiphase machine systems. Systems and method of these types capable of accurately identifying faults in a six or more phase system would be especially desirable.

SUMMARY

Disclosed examples include a method for operating a processing system to identify faults in an electric machine system including a multiphase machine having plurality of sets of windings. Embodiments comprise: receiving parameter information representative of electrical operating parameters of the multiple phases of each of the multiple winding sets of the multiphase machine; determining symmetrical components of the multiple phases for each of the multiple winding sets based on the parameter information; comparing the symmetrical components of the multiple phases of each of the multiple winding sets to fault information defining faults of the multiple phases of the multiple winding sets with respect to symmetrical component fault values; and identifying faults in one or more of the multiple phases of the multiple winding sets based on the comparison.

Embodiments include the use of the method for identifying multiphase faults, and/or for identifying multiphase faults in a six-phase motor including two winding sets.

For example, the method can be used for identifying one of more of (1) a phase AB fault, (2) a phase BC fault, (3) a phase CA fault, (4) a phase DE fault, (5) a phase EF fault, or (6) a phase DF fault, wherein: (i) determining symmetrical components includes determining a positive sequence value PS1, negative sequence value NS1 and zero sequence value ZS1 for the first winding set; and a positive sequence value PS2, negative sequence value NS2 and zero sequence value ZS3 for the second winding set; and (ii) comparing the symmetrical components to fault information includes comparing the symmetrical components PS1, NS1, ZS1, PS2, NS2, ZS2 to fault information defining the faults with respect to predetermined symmetrical component fault values including:

| | |
|---|---|
| Phase AB | Magnitudes |
| | NS1 and ZS1 are about equal and finite values, |
| | PS2 is about a finite value, |
| | NS2 and ZS2 are about zero |
| | Phase Angles |
| | Phase angle of NS1 is about −120 degrees, |
| | Phase angle of ZS1 is about 120 degrees |
| Phase BC | Magnitudes |
| | NS1 and ZS1 are about equal and finite values, |
| | PS2 is about a finite value, |
| | NS2 and ZS2 are about zero |
| | Phase Angles |
| | Phase angle of NS1 is about 0 degrees, |
| | Phase angle of ZS1 is about 0 degrees |
| Phase CA | Magnitudes |
| | NS1and ZS1 are about equal and finite values, |
| | PS2 is about a finite value, |
| | NS2 and ZS2 are about zero |
| | Phase Angles |
| | Phase angle of NS1 is about 120 degrees, |
| | Phase angle of ZS1 is about −120 degrees |
| Phase DE | Magnitudes |
| | NS2 and ZS2 are about equal and finite values, |
| | PS1 is about a finite value, |
| | NS1 and ZS1 are about zero |
| | Phase Angles |
| | Phase angle of NS2 is about −150 degrees, |
| | Phase angle of ZS2 is about 90 degrees |
| Phase EF | Magnitudes |
| | NS2 and ZS2 are about equal and finite values, |
| | PS1 is about a finite value, |
| | NS1 and ZS1 are about zero |
| | Phase Angles |
| | Phase angle of NS2 is about −30 degrees, |
| | Phase angle of ZS2 is about −30 degrees |
| Phase DF | Magnitudes |
| | NS2 and ZS2 are about equal and finite values, |
| | PS1 is about a finite value, |
| | NS1 and ZS1 are about zero |
| | Phase Angles |
| | Phase angle of NS2 is about 90 degrees, |
| | Phase angle of ZS2 is about −150 degrees |

As another example, the method can be used for identifying one or more of (7) a phase CA fault where phase A is more critical than phase C, (8) a phase CA fault where phase C is more critical than phase A, (9) a phase AB fault where phase A is more critical than phase B, (10) a phase AB fault where phase B is more critical than phase A, (11) a phase BC fault where phase B is more critical than phase C, (12) a phase BC fault where phase C is more critical than phase B, (13) a phase DF fault where phase D is more critical than phase F, (14) a phase DF fault where phase F is more critical than phase D, (15) a phase DE fault where phase D is more critical than phase E, (16) a phase DE fault where phase E is more critical than phase D, (17) a phase EF fault where phase E is more critical than phase F, or (18) a phase EF fault where phase F is more critical than phase E, wherein: (iii) comparing the symmetrical components to fault information includes comparing the symmetrical components PS1, NS1, ZS1, PS2, NS2, ZS2 to fault information defining the faults with respect to predetermined symmetrical component fault values including:

| | |
|---|---|
| Phase CA where Phase A is more critical than Phase C | Magnitudes<br>NS1 and ZS1 are about equal and finite values,<br>PS2 is about a finite value,<br>NS2 and ZS2 are about zero<br>Phases<br>Phase angle of NS1 is between about +120 and +180 degrees,<br>Phase angle of ZS1 is between about −120 and −180 degrees |
| Phase CA where Phase C is more critical than Phase A | Magnitudes<br>NS1and ZS1 are about equal and finite values,<br>PS2 is about a finite value,<br>NS2 and ZS2 are about zero<br>Phase Angles<br>Phase angle of NS1 is between about +60 and +120 degrees,<br>Phase angle of ZS1 is between about −60 and −120 degrees |
| Phase AB where Phase A is more critical than Phase B | Magnitudes<br>NS1 and ZS1 are about equal and finite values,<br>PS2 is about a finite value,<br>NS2 and ZS2 are about zero<br>Phase Angles<br>Phase angle of NS1 is between about −120 and −180 degrees,<br>Phase angle of ZS1 is between about +120 and +180 degrees |
| Phase AB where Phase B is more critical than Phase A | Magnitudes<br>NS1 and ZS1 are about equal and finite values,<br>PS2 is about a finite value,<br>NS2 and ZS2 are about zero<br>Phase Angles<br>Phase angle of NS1 is between about −60 and −120 degrees,<br>Phase angle of ZS1 is between about +60 and +120 degrees |
| Phase BC where Phase B is more critical than Phase C | Magnitudes<br>NS1 and ZS1 are about equal and finite values,<br>PS2 is about a finite value,<br>NS2 and ZS2 are about zero<br>Phase Angles<br>Phase angle of NS1 is between about 0 and −60 degrees,<br>Phase angle of ZS1 is between about 0 and +60 degrees |
| Phase BC where Phase C is more critical than Phase B | Magnitudes<br>NS1 and ZS1 are about equal and finite values,<br>PS2 is about a finite value,<br>NS2 and ZS2 are about zero<br>Phase Angles<br>Phase angle of NS1 is between about 0 and 60 degrees,<br>Phase angle of ZS1 is between about 0 to −60 degrees |
| Phase DF where Phase D is more critical than Phase F | Magnitudes<br>NS2 and ZS2 are about equal and finite values,<br>PS1 is about a finite value,<br>NS1 and ZS1 are about zero<br>Phase Angles<br>Phase angle of NS2 is between about 130 and +90 degrees,<br>Phase angle of ZS2 is between about 160 and 180 degrees or between −180 and −150 degrees |
| Phase DF where Phase F is more critical than Phase D | Magnitudes<br>NS2 and ZS2 are about equal and finite values,<br>PS1 is about a finite value,<br>NS1 and ZS1 is about zero<br>Phase Angles<br>Phase angle of NS2 is between about +45 and +90 degrees,<br>Phase angle of ZS2 is between about −100 and −160 degrees |
| Phase DE where Phase D is more critical than Phase E | Magnitudes<br>NS2 and ZS2 are about equal and finite values,<br>PS1 is about a finite value,<br>NS1 and ZS1 are about zero<br>Phase Angles<br>Phase angle of NS2 is between about +160 and 180 degrees, or between about −140 and −180 degrees and phase angle of ZS2 is between about 120 to 90 degrees |
| Phase DE where Phase E is more critical than Phase D | Magnitudes<br>NS2 and ZS2 are about equal and finite values,<br>PS1 is about a finite value,<br>NS1 and ZS1 are about zero<br>Phase Angles<br>Phase angle of NS2 is between about −150 to −110 degrees,<br>Phase angle of ZS2 is between about +40 to +90 degrees |
| Phase EF where Phase E is more critical than Phase F | Magnitudes<br>NS2 and ZS2 are about equal and finite values,<br>PS1 is about a finite value,<br>NS1 and ZS1 are about zero<br>Phase Angles<br>Phase angle of NS2 is between about −30 to −80 degrees,<br>Phase angle of ZS2 is between about −30 to 20 degrees |

| | |
|---|---|
| Phase EF where Phase F is more critical than Phase E | Magnitudes<br>NS2 and ZS2 are about equal and finite values,<br>PS1 is about a finite value,<br>NS1 and ZS1 are about zero<br>Phase Angles<br>Phase angle of NS2 is between about 20 to −30 degrees,<br>Phase angle of ZS2 is between about −80 to −30 degrees |

As another example, the method can be used for identifying one or more of (19) a phase A fault, (20) a phase B fault, (21) a phase C fault, (22) a phase D fault, (23) a phase E fault, or (24) a phase F fault, wherein: (iv) comparing the symmetrical components to fault information includes comparing the symmetrical components PS1, NS1, ZS1, PS2, NS2, ZS2 to fault information defining the faults with respect to predetermined symmetrical component fault values including:

| | |
|---|---|
| Phase A | Magnitudes<br>NS1 and ZS1 are about equal and finite values,<br>PS2 is about a finite value,<br>NS2 and ZS2 are about zero<br>Phase Angles<br>Phase angle of NS1 and ZS1 are about the same oscillating at 180 or at −180 degrees |
| Phase B | Magnitudes<br>NS1 and ZS1 are about equal and finite values,<br>PS2 is about a finite value,<br>NS2 and ZS2 are about zero<br>Phase Angles<br>Phase angle of NS1 is about −60 degrees,<br>Phase angle of ZS1 is about 60 degrees |
| Phase C | Magnitudes<br>NS1 and ZS1 are about equal and finite values,<br>PS2 is about a finite value,<br>NS2 and ZS2 are about zero<br>Phase Angles<br>Phase angle of NS1 is about 60 degrees,<br>Phase angle of ZS1 is about −60 degrees |
| Phase D | Magnitudes<br>NS2 and ZS2 are about equal and finite values,<br>PS1 is about a finite value,<br>NS1 and ZS1 are about zero<br>Phase Angles<br>Phase angle of NS2 is about 150 degrees,<br>Phase angle of ZS2 is about 150 degrees |
| Phase E | Magnitudes<br>NS2 and ZS2 are about equal and finite values,<br>PS1 is about a finite value,<br>NS1 and ZS1 are about zero<br>Phase Angles<br>Phase angle of NS2 is about −90 degrees,<br>Phase angle of ZS2 is about 30 degrees |
| Phase F | Magnitudes<br>NS2 and ZS2 are about equal and finite values,<br>PS1 is about a finite value,<br>NS1 and ZS1 are about zero<br>Phase Angles<br>Phase angle of NS2 is about 30 degrees,<br>Phase angle of ZS2 is about −90 degrees |

Embodiments of the method can be used for identifying one or more of (1) a phase CA fault where phase A is more critical than phase C, (2) a phase CA fault where phase C is more critical than phase A, (3) a phase AB fault where phase A is more critical than phase B, (4) a phase AB fault where phase B is more critical than phase A, (5) a phase BC fault where phase B is more critical than phase C, (6) a phase BC fault where phase C is more critical than phase B, (7) a phase DF fault where phase D is more critical than phase F, (8) a phase DF fault where phase F is more critical than phase D, (9) a phase DE fault where phase D is more critical than phase E, (10) a phase DE fault where phase E is more critical than phase D, (11) a phase EF fault where phase E is more critical than phase F, or (12) a phase EF fault where phase F is more critical than phase E, wherein: (i) determining symmetrical components includes determining: a positive sequence value PS1, negative sequence value NS1 and zero sequence value ZS1 for the first winding set; and a positive sequence value PS2, negative sequence value NS2 and zero sequence value ZS3 for the second winding set; and (ii) comparing the symmetrical components to fault information includes comparing the symmetrical components PS1, NS1, ZS1, PS2, NS2, ZS2 to fault information defining the faults with respect to predetermined symmetrical component fault values including:

| | |
|---|---|
| Phase CA where Phase A is more critical than Phase C | Magnitudes<br>NS1 and ZS1 are about equal and finite values,<br>PS2 is about a finite value,<br>NS2 and ZS2 are about zero<br>Phases<br>Phase angle of NS1 is between about +120 and +180 degrees,<br>Phase angle of ZS1 is between about −120 and −180 degrees |
| Phase CA where Phase C is more critical than Phase A | Magnitudes<br>NS1 and ZS1 are about equal and finite values,<br>PS2 is about a finite value,<br>NS2 and ZS2 are about zero<br>Phase Angles<br>Phase angle of NS1 is between about +60 and +120 degrees,<br>Phase angle of ZS1 is between about −60 and −120 degrees |

| | |
|---|---|
| Phase AB where Phase A is more critical than Phase B | Magnitudes<br>NS1 and ZS1 are about equal and finite values,<br>PS2 is about a finite value,<br>NS2 and ZS2 are about zero<br>Phase Angles<br>Phase angle of NS1 is between about −120 and −180 degrees,<br>Phase angle of ZS1 is between about +120 and +180 degrees |
| Phase AB where Phase B is more critical than Phase A | Magnitudes<br>NS1 and ZS1 are about equal and finite values,<br>PS2 is about a finite value,<br>NS2 and ZS2 are about zero<br>Phase Angles<br>Phase angle of NS1 is between about −60 and −120 degrees,<br>Phase angle of ZS1 is between about +60 and +120 degrees |
| Phase BC where Phase B is more critical than Phase C | Magnitudes<br>NS1 and ZS1 are about equal and finite values,<br>PS2 is about a finite value,<br>NS2 and ZS2 are about zero<br>Phase Angles<br>Phase angle of NS1 is between about 0 and −60 degrees,<br>Phase angle of ZS1 is between about 0 and +60 degrees |
| Phase BC where Phase C is more critical than Phase B | Magnitudes<br>NS1 and ZS1 are about equal and finite values,<br>PS2 is about a finite value,<br>NS2 and ZS2 are about zero<br>Phase Angles<br>Phase angle of NS1 is between about 0 and 60 degrees,<br>Phase angle of ZS1 is between about 0 to −60 degrees |
| Phase DF where Phase D is more critical than Phase F | Magnitudes<br>NS2 and ZS2 are about equal and finite values,<br>PS1 is about a finite value,<br>NS1 and ZS1 are about zero<br>Phase Angles<br>Phase angle of NS2 is between about 130 and +90 degrees,<br>Phase angle of ZS2 is between about 160 and 180 degrees or between −180 and −150 degrees |
| Phase DF where Phase F is more critical than Phase D | Magnitudes<br>NS2 and ZS2 are about equal and finite values,<br>PS1 is about a finite value,<br>NS1 and ZS1 is about zero<br>Phase Angles<br>Phase angle of NS2 is between about +45 and +90 degrees,<br>Phase angle of ZS2 is between about −100 and −160 degrees |
| Phase DE where Phase D is more critical than Phase E | Magnitudes<br>NS2 and ZS2 are about equal and finite values,<br>PS1 is about a finite value,<br>NS1 and ZS1 are about zero<br>Phase Angles<br>Phase angle of NS2 is between about +160 and 180 degrees, or between about −140 and −180 degrees and phase angle of ZS2 is between about 120 to 90 degrees |
| Phase DE where Phase E is more critical than Phase D | Magnitudes<br>NS2 and ZS2 are about equal and finite values,<br>PS1 is about a finite value,<br>NS1 and ZS1 are about zero<br>Phase Angles<br>Phase angle of NS2 is between about −150 to −110 degrees,<br>Phase angle of ZS2 is between about +40 to +90 degrees |
| Phase EF where Phase E is more critical than Phase F | Magnitudes<br>NS2 and ZS2 are about equal and finite values,<br>PS1 is about a finite value,<br>NS1 and ZS1 are about zero<br>Phase Angles<br>Phase angle of NS2 is between about −30 to −80 degrees,<br>Phase angle of ZS2 is between about −30 to 20 degrees |
| Phase EF where Phase F is more critical than Phase E | Magnitudes<br>NS2 and ZS2 are about equal and finite values,<br>PS1 is about a finite value,<br>NS1 and ZS1 are about zero<br>Phase Angles<br>Phase angle of NS2 is between about 20 to −30 degrees,<br>Phase angle of ZS2 is between about −80 to −30 degrees |

In embodiments, receiving parameter information includes receiving parameter information representative of one or both or current or voltage of the multiple phases of each of the multiple winding sets of the multiphase machine. Identifying the fault may include identifying the fault as one of a motor fault or an inverter fault.

DETAILED DESCRIPTION

Figure 1:
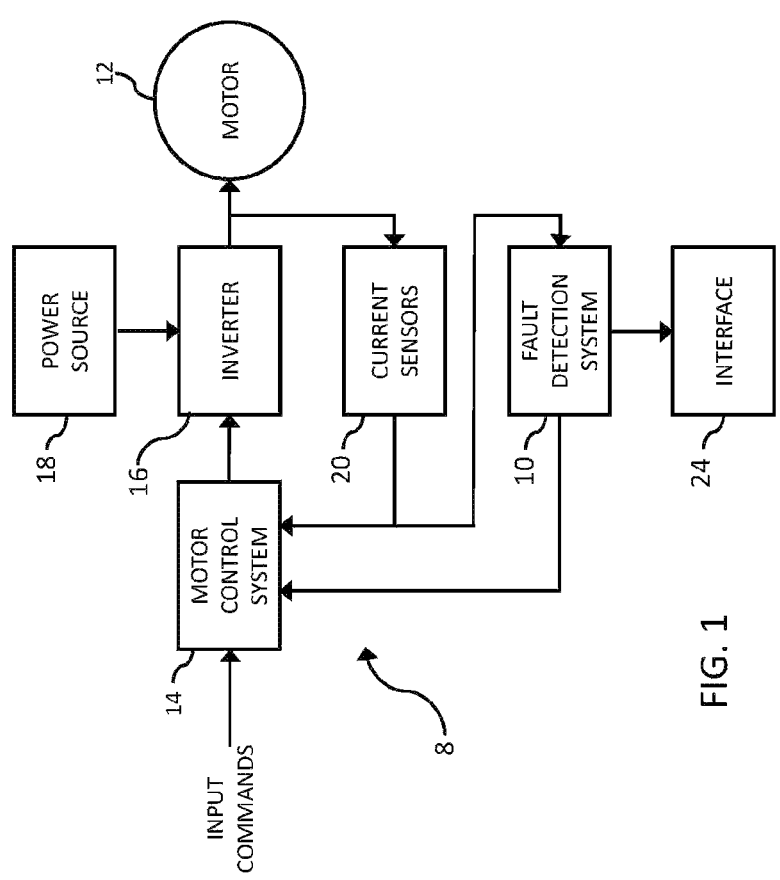
FIG. 1 is a diagrammatic illustration of a motor system including a fault detection system in accordance with embodiments.

FIG. 1 is a diagrammatic illustration of a motor system 8 including a fault detection system 10, motor 12 and motor control system 14 in accordance with embodiments. Outputs of the motor control system 14 are coupled to an inverter 16. Inverter 16 is responsive to the outputs of the motor control system 14, and controls the application of power from a source 18 to the motor 12. In addition to control input commands such as a torque request, motor control system 14 is coupled to receive feedback inputs representative of electrical operating characteristics or parameters of the motor 12. In the embodiments illustrated in FIG. 1, current sensors 20 provide sensed current parameters to the motor control system 14. Although not shown, embodiments may include a resolver system for providing feedback information regarding mechanical operating characteristics or parameters of the motor to the motor control system 14. In response to input commands and the feedback inputs, motor control system 14 provides output drive signals or commands that cause the motor 12 to provide the commanded outputs such as torque levels.

As described in greater detail below, fault detection system 10 monitors the feedback inputs such as those provided by current sensors 20 and identifies faults in the motor 12 and/or inverter 16. Embodiments the fault detection system 10 are configured to provide fault tolerance control capabilities to the motor system 8. For example, the fault detection system 10 is coupled to the motor control system 14 in the illustrated embodiments. In response to information from the fault detection system 14 indicating the occurrence of faults in the motor 12 or inverter 16, motor control system 14 may implement control algorithms accommodate the identified faults but otherwise enable the motor 12 to operate. Alternatively or additionally, the fault detection system 10 may actuate a circuit breaker or other control functionality that causes the motor 12 to stop operation. Yet other embodiments include an interface 24 coupled to the fault detection system 10. Interface 24, which can provide visual and/or audible outputs, can be actuated by the fault detection system 10 to notify an operator of the identified faults in the motor system 8. The operator may then take appropriate actions based on the identified faults.

In embodiments, motor 12 is a multiphase electric machine having multiple rotor and stator windings. For example, motor 12 may be an interior permanent magnet (IPM) motor, an induction motor, or a synchronous motor. Although a six-phase motor 12 having multiple winding sets is described below as an exemplary embodiment, embodiments include machines having more phases (e.g., a nine, twelve or more phase machine). Power sources can include a battery, fuel cell, conventional power grid or any other energy source suitable for the motor 12 and its application, and is a direct current (DC) source in embodiments. Although described in connection with a motor system 8 and motor 12, fault detection system 10 can be incorporated into other multiphase electric machine systems, such as for example a system including a multiphase generator having multiple sets of windings.

Figure 2:
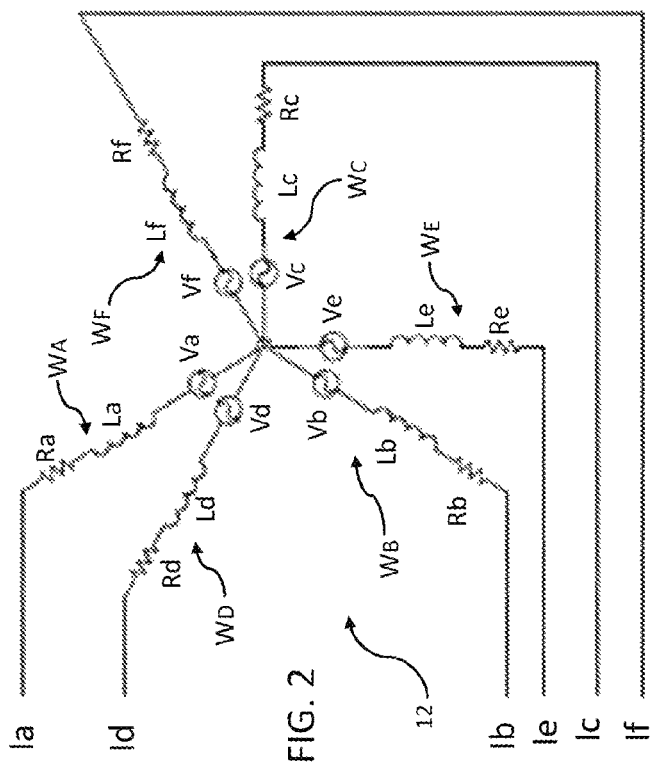
FIG. 2 is an electrical system model of a six-phase AC motor.
Figure 5:
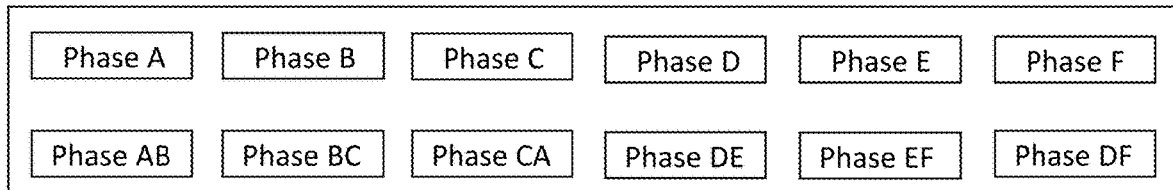
FIG. 5 is a diagrammatic illustration of certain phases of a six-phase motor, in accordance with embodiments.

FIG. 2 is an electrical model of a six-phase motor 12 with which the fault detection system 10 is configured for use in embodiments. As shown, the six-phase motor 12 includes six windings WA-WF arranged as two sets of three-phase windings (e.g. a first set of windings and a second set of winding). For purposes of convention and description, the first set of windings are identified as winding WA-WC and the second set as windings WD-WF. Each of the windings WA-WF is characterized by a resistance Ra-Rf, inductance La-Lf and induced voltage Va-Vf, respectively. As shown diagrammatically in FIG. 5, the six-phase motor 12 can be characterized by a number of phases, including Phases A, B, C, D, E, F, AB, BC, CA, DE, EF and DF. Motor 12 operates in response to voltage drive signals or commands applied by the inverter 16. The motor control system 14 provides voltage drive commands VA-VF (not illustrated in FIG. 2) to the inverter 16. Inverter 16 processes the voltage drive commands and applies the commanded voltages to the windings WA-WF. The voltage drive commands may be pulse-width modulated (PWM) signals. The applied voltages create torque-producing currents Ia-If in the windings WA-WF, respectively, that result in rotation of the motor shaft (not separately shown). Inverter 16 can be of any known or otherwise conventional design. Such inverters 16 commonly include a plurality of power transistors or other switches to provide the PWM drive signals.

Figure 3:
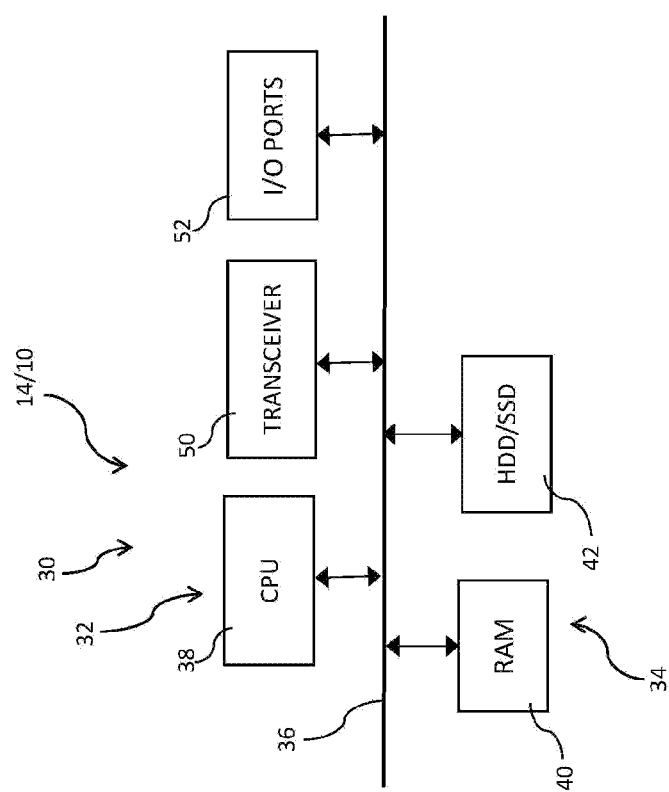
FIG. 3 is diagrammatic illustration of functional components of an exemplary fault detection system and/or motor control system in accordance with embodiments.
Figure 4A:
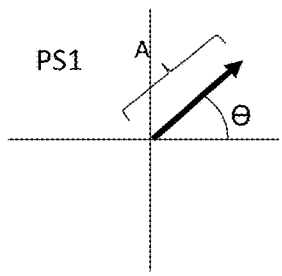
FIGS. 4A-4F are diagrammatic illustrations of examplary symmetrical components PS1, NS1, ZS1, PS2, NS2 and ZS2, respectively, in accordance with embodiments.
Figure 4B:
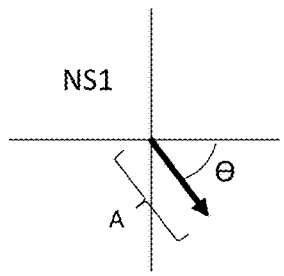
Figure 4C:
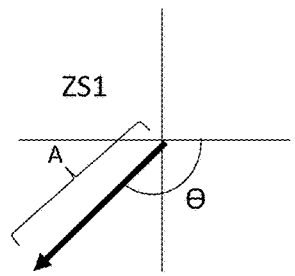
Figure 4D:
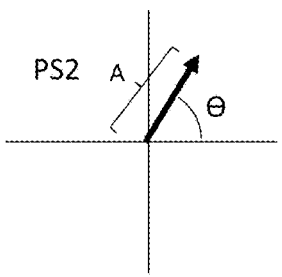
Figure 4E:
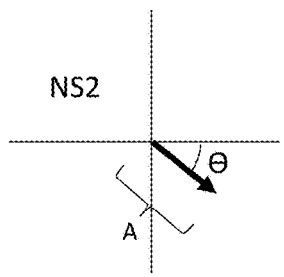
Figure 4F:
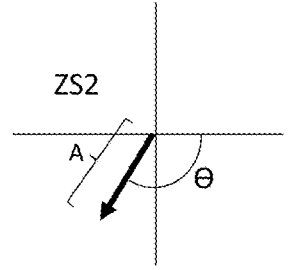

FIG. 3 is a diagrammatic illustration of exemplary functional components of the motor control system 14 in accordance with embodiments. As described below, the fault detection system 10 may be implemented by functional components that are the same as or similar to those described in connection with FIG. 3. The illustrated embodiments include a processing system 30 comprising processing components 32 and storage components 34 coupled by a bus 36. Processing components 32 may, for example, include one or more central processing units (CPUs) 38 providing the processing functionality of the motor control system 14. The storage components 34 may include RAM memory 40, hard disk drive (HDD) and/or solid state drive (SSD) memory 42, providing the information and other data storage functionality of the motor control system 14. For example, operating system and other software used by the processing components 32 to implement the motor control methods and algorithms may be stored in the storage components 34. Components of the processing system 30 can be implemented as programmed microprocessors, application specific integrated circuits (ASICs), controllers and/or discrete circuit components. Other embodiments of the processing system 30 are implemented using other conventional or otherwise known systems or devices. The embodiments illustrated in FIG. 3 also include input/output (I/O) ports 52 through which the motor control system 14 can receive and transmit information or other data. For example, in embodiments, the current sensors 20 can be coupled to the processing components 32 through the I/O ports 52. Alternatively and/or additionally, I/O ports 52 can couple the processing components 32 to the fault detection system 10 and/or interface 24.

Current sensors 20 are coupled to the motor 12 and provide signals representative of the current (I) on each of the windings WA-WF of the motor. In embodiments such as those described below comprising a six-phase motor 12, current sensors 20 provide feedback signals $I_A$, $I_B$, $I_C$, $I_D$, $I_E$, $I_F$ (IA-IF; not labeled in FIG. 2) representative of the currents Ia-If in the windings WA-WF, respectively, respectively. Current sensors 20 can be any known or otherwise conventional devices. In embodiments, current sensors 20 provide information representative of the magnitude or levels of the currents on the windings WA-WF of motor 12. With the current level information provided by current sensors 20, motor control system 14 can derive information regarding the relative phases of the signals $I_A$-$I_F$, which will be representative of the phases of the currents Ia-If in the windings of the motor 12. In other embodiments, the current sensors 20 directly provide information regarding the phases of the motor winding currents. Yet other embodiments of the motor system 8 include sensors that provide additional or alternative information representative of electrical operating characteristics or parameters of the motor 12. Although shown as current sensors 20 in the illustrated embodiments, other embodiments of motor system 8 include other sensors for providing information representative of the electrical operating characteristics or parameters of the motor 12 used by the motor system 8. For example, in embodiments (not shown) voltage sensors can be used to provide information representative of the amplitudes and phases of the voltages Va-Vf in the windings WA-WF of the motor 12, and the voltages in the windings may be used by the fault detection system 10.

In embodiments, motor control system 14 is configured to receive a control input command specifying a desired amount of torque to be produced by motor 12. Motor control system 14 may also receive the current feedback signals $I_A$-$I_F$, from current sensors 20, and optionally feedback signals representative of the angular position of the shaft of the motor 12. Motor control system 14 processes the torque control input command and feedback signals to produce the voltage drive signals that are applied to the inverter 16. In embodiments such as those described herein comprising a six-phase motor 12, motor control system 14 produces voltage drive signal voltages VA-VF for application to the windings WA-WF, respectively, of the motor. Motor control system 14 produces the voltage drive signals VA-VF based on a control algorithm. In embodiments, motor control system 14 implements flux-weakening (FW) and maximum-torque-per-ampere (MTPA) control algorithms to produce the voltage drive signals as a function of the input command and feedback signals. FW and MTPA algorithms are generally known, and any such conventional or otherwise known algorithm suitable for the application of the motor system 8 and/or motor 12 can be used.

Fault detection system 10 monitors the feedback signals representative of the electrical operating parameters of the motor 12 and identifies faults in the windings WA-WF of the motor 12 and/or faults in the inverter 16 based on the operating parameters. In embodiments described below, symmetrical components of the operating motor 12 (e.g., magnitudes and phase angles of the symmetrical components) are determined and used as the basis to identify faults in the motor 12 and/or inverter 16. Although the feedback current signals $I_A$-$I_F$, are used to determine the symmetrical components in embodiments described below, other embodiments use other feedback information representative of the electrical operating parameters of the motor 12, such as feedback signals representative of the voltages Va-Vf in the windings WA-WF, respectively.

In embodiments, physical components of the fault detection system 10 can be embodied by components that are substantially the same as or similar to those of the motor control system 14 described above. In other embodiments, the motor control system 14 and fault detection system 10 shown in FIG. 1 are logical components of a common physical information processing system. Any suitable conventional or otherwise known information processing system configuration can be used to provide the functionality of the fault detection system 10 described herein. In embodiments, memory such as that described above in connection with the storage components 34 of FIG. 3 may store software such as instructions representative of the algorithms or steps of the methods described herein that are executed by the processing components such as 32 of the system 10 and/or the fault information described below. In yet other embodiments all or portions of such software, instructions, fault information or other data used by the fault detection system 10 can be stored at remote locations (e.g., cloud storage) and accessed by the fault detection system.

For each set of windings of the motor 12, the associated symmetrical components are characterized by a positive sequence (PS), negative sequence (NS) and zero sequence (ZS). Accordingly, the six-phase motor 12 illustrated by FIG. 2 has a first set symmetrical components, PS1, NS1, ZS1 representing the electrical characteristics of the first set of windings WA-WC, and a second set of symmetrical components PS2, NS2, ZS2 representing the electrical characteristics of the second set windings WD-WF. As shown diagrammatically in FIGS. 4A-4F, these symmetrical components may be represented by the notation A∠θ, where A is the amplitude or magnitude of the component and θ is the phase angle of the component. Fault detection system 10 may compute these symmetrical components. In embodiments, the symmetrical components are computed based on parameters such as the current feedback signals IA-IF by the equations below:

First Winding Set Symmetrical Components $$PS1 = \frac{1}{3}(I_A + a I_B + a^2 I_C) \quad \text{Eq. 1}$$

$$NS1 = \frac{1}{3}(I_A + a^2 I_B + a I_C) \quad \text{Eq. 2}$$

$$ZS1 = \frac{1}{3}(I_A + I_B + I_C) \text{ where } a = 1 \angle 120 \quad \text{Eq. 3}$$

Second Winding Set Symmetrical Components $$PS2 = \frac{1}{3}(I_D + a I_E + a^2 I_F) \quad \text{Eq. 4}$$

$$NS2 = \frac{1}{3}(I_D + a^2 I_E + a I_F) \quad \text{Eq. 5}$$

$$ZS2 = \frac{1}{3}(I_D + I_E + I_F) \text{ where } a = 1 \angle 120 \quad \text{Eq. 6}$$

Fault detection system 10 accesses stored fault information defining or characterizing faults in the motor 12 and/or inverter 16 on the basis of the symmetrical components PS1, NS1, ZS1 and PS2, NS2 and ZS2. In embodiments, fault detection system 10 includes a stored record of the fault information used to determine the faults. Tables 1 and 2 below describe the fault information for a six-phase motor 12 in accordance with embodiments as predetermined symmetric component values. In effect, the listed symmetric component values are signatures that characterize the associated faults. In other embodiments the fault information may be defined by other approaches, such as formulas or equations.

TABLE 1

First Winding Set

| Fault | Characteristic Symmetric Component Values |
|---|---|
| Phase A only | Magnitudes<br>NS1 and ZS1 are equal and finite values,<br>PS2 is finite value,<br>NS2 and ZS2 are zero<br>Phase Angles<br>Phase angle of NS1 and ZS1 are same oscillating at 180 or at −180 degrees |
| Phase B only | Magnitudes<br>NS1 and ZS1 are equal and finite values,<br>PS2 is finite value,<br>NS2 and ZS2 are zero<br>Phase Angles<br>Phase angle of NS1 is −60 degrees,<br>Phase angle of ZS1 is 60 degrees |
| Phase C Only | Magnitudes<br>NS1 and ZS1 are equal and finite values,<br>PS2 is finite value,<br>NS2 and ZS2 are zero<br>Phase Angles<br>Phase angle of NS1 is 60 degrees,<br>Phase angle of ZS1 is −60 degrees |
| Phase AB only | Magnitudes<br>NS1 and ZS1 are equal and finite values,<br>PS2 is finite value,<br>NS2 and ZS2 are zero<br>Phase Angles<br>Phase angle of NS1 is −120 degrees,<br>Phase angle of ZS1 is 120 degrees |
| Phase BC only | Magnitudes<br>NS1 and ZS1 are equal and finite values,<br>PS2 is finite value,<br>NS2 and ZS2 are zero<br>Phase Angles<br>Phase angle of NS1 is 0 degrees,<br>Phase angle of ZS1 is 0 degrees |
| Phase CA only | Magnitudes<br>NS1 and ZS1 are equal and finite values,<br>PS2 is finite value,<br>NS2 and ZS2 are zero<br>Phase Angles<br>Phase angle of NS1 is 120 degrees,<br>Phase angle of ZS1 is −120 degrees |
| Phase CA only where Phase A is more critical than Phase C | Magnitudes<br>NS1 and ZS1 are equal and finite values,<br>PS2 is finite value,<br>NS2 and ZS2 are zero<br>Phases<br>Phase angle of NS1 is between +120 and +180 degrees,<br>Phase angle of ZS1 is between −120 and −180 degrees |
| Phase CA only where Phase C is more critical than Phase A | Magnitudes<br>NS1 and ZS1 are equal and finite values,<br>PS2 is finite value,<br>NS2 and ZS2 are zero<br>Phase Angles<br>Phase angle of NS1 is between +60 and +120 degrees,<br>Phase angle of ZS1 is between −60 and −120 degrees |
| Phase AB only where Phase A is more critical than Phase B | Magnitudes<br>NS1 and ZS1 are equal and finite values,<br>PS2 is finite value,<br>NS2 and ZS2 are zero<br>Phase Angles<br>Phase angle of NS1 is between −120 and −180 degrees,<br>Phase angle of ZS1 is between +120 and +180 degrees |

TABLE 1-continued

| | First Winding Set |
|---|---|
| Fault | Characteristic Symmetric Component Values |
| Phase AB only where Phase B is more critical than Phase A | Magnitudes<br>NS1 and ZS1 are equal and finite values,<br>PS2 is finite value,<br>NS2 and ZS2 are zero<br>Phase Angles<br>Phase angle of NS1 is between −60 and −120 degrees,<br>Phase angle of ZS1 is between +60 and +120 degrees |
| Phase BC only where Phase B is more critical than Phase C | Magnitudes<br>NS1 and ZS1 are equal and finite values,<br>PS2 is finite value,<br>NS2 and ZS2 are zero<br>Phase Angles<br>Phase angle of NS1 is between 0 and −60 degrees,<br>Phase angle of ZS1 is between 0 and +60 degrees |
| Phase BC only where Phase C is more critical than Phase B | Magnitudes<br>NS1 and ZS1 are equal and finite values,<br>PS2 is finite value,<br>NS2 and ZS2 are zero<br>Phase Angles<br>Phase angle of NS1 is between 0 and 60 degrees,<br>Phase angle of ZS1 is between 0 to −60 degrees |

TABLE 2

| | Second Winding Set |
|---|---|
| Fault | Symmetric Components Values |
| Phase D only | Magnitudes<br>NS1 and ZS2 are equal and finite values,<br>PS1 is finite value,<br>NS1 and ZS1 are zero<br>Phase Angles<br>Phase angle of NS2 is 150 degrees,<br>Phase angle of ZS2 is 150 degrees |
| Phase E only | Magnitudes<br>NS2 and ZS2 are equal and finite values,<br>PS1 is finite value,<br>NS1 and ZS1 are zero<br>Phase Angles<br>Phase angle of NS2 is −90 degrees,<br>Phase angle of ZS2 is 30 degrees |
| Phase F Only | Magnitudes<br>NS2 and ZS2 are equal and finite values,<br>PS1 is finite value,<br>NS1 and ZS1 are zero<br>Phase Angles<br>Phase angle of NS2 is 30 degrees,<br>Phase angle of ZS2 is −90 degrees |
| Phase DE only | Magnitudes<br>NS2 and ZS2 are equal and finite values,<br>PS1 is finite value,<br>NS1 and ZS1 are zero<br>Phase Angles<br>Phase angle of NS2 is −150 degrees,<br>Phase angle of ZS2 is 90 degrees |
| Phase EF only | Magnitudes<br>NS2 and ZS2 are equal and finite values,<br>PS1 is finite value,<br>NS1 and ZS1 are zero<br>Phase Angles<br>Phase angle of NS2 is −30 degrees,<br>Phase angle of ZS2 is −30 degrees |
| Phase DF only | Magnitudes<br>NS2 and ZS2 are equal and finite values,<br>PS1 is finite value,<br>NS1 and ZS1 are zero<br>Phase Angles<br>Phase angle of NS2 is 90 degrees,<br>Phase angle of ZS2 is −150 degrees |

TABLE 2-continued

Second Winding Set

| Fault | Symmetric Components Values |
|---|---|
| Phase DF only where Phase D is more critical than Phase F | Magnitudes<br>NS2 and ZS2 are equal and finite values,<br>PS1 is finite value,<br>NS1 and ZS1 are zero<br>Phase Angles<br>Phase angle of NS2 is between 130 and +90 degrees,<br>Phase angle of ZS2 is between 160 and 180 degrees or between −180 and −150 degrees |
| Phase DF only where Phase F is more critical than Phase D | Magnitudes<br>NS2 and ZS2 are equal and finite values,<br>PS1 is finite value,<br>NS1 and ZS1 are zero<br>Phase Angles<br>Phase angle of NS2 is between +45 and +90 degrees,<br>Phase angle of ZS2 is between −100 and −160 degrees |
| Phase DE only where Phase D is more critical than Phase E | Magnitudes<br>NS2 and ZS2 are equal and finite values,<br>PS1 is finite value,<br>NS1 and ZS1 are zero<br>Phase Angles<br>Phase angle of NS2 is between +160 and 180 degrees, or between −140 and −180 degrees and phase angle of ZS2 is between 120 to 90 degrees |
| Phase DE only where Phase E is more critical than Phase D | Magnitudes<br>NS2 and ZS2 are equal and finite values,<br>PS1 is finite value,<br>NS1 and ZS1 are zero<br>Phase Angles<br>Phase angle of NS2 is between −150 to −110 degrees,<br>Phase angle of ZS2 is between +40 to +90 degrees |
| Phase EF only where Phase E is more critical than Phase F | Magnitudes<br>NS2 and ZS2 are equal and finite values,<br>PS1 is finite value,<br>NS1 and ZS1 are zero<br>Phase Angles<br>Phase angle of NS2 is between −30 to −80 degrees,<br>Phase angle of ZS2 is between −30 to 20 degrees |
| Phase EF only where Phase F is more critical than Phase E | Magnitudes<br>NS2 and ZS2 are equal and finite values,<br>PS1 is finite value,<br>NS1 and ZS1 are zero<br>Phase Angles<br>Phase angle of NS2 is between 20 to −30 degrees,<br>Phase angle of ZS2 is between −80 to −30 degrees |

The magnitude and phase angle values listed in Charts 1 and 2 above are approximate values. Motor systems 8 may include delays and nonlinearities and other factors that may result in ranges of tolerances associated with the listed magnitudes and phase angle values. Accordingly, the listed magnitudes and phase angle values should be interpreted to mean "about" those values, and encompass values that represent associated electrical characteristics of the motor system 8. Listed "finite values" generally means non-zero values, and "equal" values mean values that are effectively the same within the range of tolerances accommodated by the motor system 8. For example, magnitudes within +/−5% of the listed magnitudes and phase angles within +/−5 degrees of the listed phase angles may be within the range of tolerances accommodated by the motor system 8.

For example, the term "about" may be used to refer to a measurement that includes the stated measurement and that also includes any measurements that are reasonably close to the stated measurement. Measurements that are reasonably close to the stated measurement deviate from the stated measurement by a reasonably small amount as understood and readily ascertained by individuals having ordinary skill in the relevant arts. Such deviations may be attributable to measurement error, differences in measurement and/or manufacturing equipment calibration, human error in reading and/or setting measurements, minor adjustments made to optimize performance and/or structural parameters in view of differences in measurements associated with other components, particular implementation scenarios, imprecise adjustment and/or manipulation of objects by a person or machine, and/or the like, for example. In the event it is determined that individuals having ordinary skill in the relevant arts would not readily ascertain values for such reasonably small differences, the term "about" can be understood to mean plus or minus 10% of the stated value.

Following the calculations of the symmetric components such as PS1, NS1, ZS1, PS2, NS2, ZS2, fault detection system 10 compares the symmetric components to the fault information. Faults in the electrical machine system 8, such as faults in one or more of the windings $W_A$-$W_F$ of the motor 12 and/or faults in the inverter 16, can be identified based on the comparison. Fault detection system 10 can identify multiphase faults in a motor system including a multiphase motor having multiple winding sets. As reflected by the fault information of Tables 1 and 2, for example, in connection with a six-phase motor 12, fault detection system 10 can identify one of more, or all, of (1) a phase AB fault, (2) a phase BC fault, (3) a phase CA fault, (4) a phase DE fault, (5) a phase EF fault, and/or (6) a phase DF fault. Alternatively or in addition, in connection with a six-phase motor 12, fault detection system 10 can identify one or more, or all, of (1) a phase CA fault where phase A is more critical than phase C, (2) a phase CA fault where phase C is more critical than phase A, (3) a phase AB fault where phase A is more critical than phase B, (4) a phase AB fault where phase B is more critical than phase A, (5) a phase BC fault where phase B is more critical than phase C, (6) a phase BC fault where phase C is more critical than phase B, (7) a phase DF fault where phase D is more critical than phase F, (8) a phase DF fault where phase F is more critical than phase D, (9) a phase DE fault where phase D is more critical than phase E, (10) a phase DE fault where phase E is more critical than phase D, (11) a phase EF fault where phase E is more critical than phase F, or (12) a phase EF fault where phase F is more critical than phase E. In embodiments, one phase of a multiphase fault may be determined to be more critical than another phase of the multiphase fault. For example, two phases may degrade over time, but one of those phases may degrade to a greater extent than the other. Although both phases may be carrying less current than healthy phases, the phase that is carrying the lowest amount of current may be identified as more critical than the other phase.

In embodiments, fault detection system 10 performs the fault identification method (e.g., symmetric components calculation and comparison to the fault information) a plurality of times (e.g., periodically). Alternatively or in addition, the fault detection system 10 can perform the symmetric components calculations periodically, and determine changes in the determined symmetric components. By periodically determining the symmetric components and/or identifying faults, the fault detection system 10 may monitor changes in the health of the motor system 8. Fault detection system 10 may also be able to predict the possibility or likelihood of a fault before the fault occurs by evaluating the temporal changes to the symmetric components. For example, in addition to checking for full failure of phases, the system 10 can operate to detect partial degradation. As an example, the system 10 can use algorithms described herein to identify pre-fault stages. Partial degradation can be identified by monitoring greater or lesser currents in faulty phases before those phases are subject to a complete failure.

In embodiments, the fault detection system 10 can distinguish between faults identified as occurring in the motor 8 and/or faults that occurring in the inverter 16. For example, if a power transistor or other switch of the inverter 16 fails, no current would be monitored in the associated phase. System 10 can thereby identify the faulty phases of the inverter 16. If a winding of the motor 12 is damaged, for example by thermal effects, the associated phase would be identified as having higher impedance causing lower current in the phase. The system 10 may identify different amplitudes and phase factors for phases that are out of order.

Fault detection system 10 provides fault tolerant control functionality in embodiments. For example, the fault detection system 10 may provide information representative of the nature of identified faults to the motor control system 14. In such embodiments the motor control system 14 may include control algorithms that compensate or otherwise adjust the operation of the motor 12 based on the identified faults. Alternatively or in addition, fault detection system 10 and/or motor control system 14 may be configured to discontinue or stop the operation of the motor 12 in response to one or more identified faults (e.g., in response to identified faults that the motor control system is not configured to compensate for). In embodiments, for example, the fault detection system 10 may trigger a circuit breaker (not shown) to disable the operation of the motor 12 (e.g., by switching off the connection between the power source 18 and inverter 16). Alternatively or in addition, the fault detection system 10 may actuate the interface 14 to provide information to an operator of the motor system 8 indicating the identification of a fault. In embodiments, the interface may provide one or more of a visual, audible or other alert to the operator. The alerts may include information identifying the nature of the identified fault.

It is to be understood that the above description is intended to be illustrative, and not restrictive. Many other embodiments will be apparent to those of skill in the art upon reading and understanding the above description. For example, although described in connection with a motor system, other embodiments include other electrical machines, such as multiphase generators. It is contemplated that features described in association with one embodiment are optionally employed in addition or as an alternative to features described in or associated with another embodiment. The scope of the invention should, therefore, be determined with reference to the appended claims, along with the full scope of equivalents to which such claims are entitled.

What is claimed is:

1. A method for operating a processing system to identify one or more of (1) a phase AB fault, (2) a phase BC fault, (3) a phase CA fault, (4) a phase DE fault, (5) a phase EF fault, or (6) a phase DF fault in an electric machine system including a multiphase machine having a plurality of sets of windings, wherein the multiphase machine includes first and second winding sets, comprising:

receiving parameter information representative of electrical operating parameters of the multiphase machine;

determining symmetrical components based on the parameter information, including determining:
 a positive sequence value PS1, negative sequence value NS1 and zero sequence value ZS1 for the first winding set; and
 a positive sequence value PS2, negative sequence value NS2 and zero sequence value ZS3 for the second winding set; and comparing the symmetrical components PS1, NS1, ZS1, PS2, NS2, ZS2 to fault information defining the faults with respect to predetermined symmetrical component fault values; and identifying faults based on the comparison, including:
 identifying a Phase AB fault when: magnitudes NS1 and ZS1 are about equal and finite values, PS2 is about a finite value, and NS2 and ZS2 are about zero, and phase angle of NS1 is about −120 degrees, and phase angle of ZS1 is about 120 degrees;
 identifying a Phase BC fault when: magnitudes NS1 and ZS1 are about equal and finite values, PS2 is about a finite value, and NS2 and ZS2 are about zero, and phase angle of NS1 is about 0 degrees, and phase angle of ZS1 is about 0 degrees;
 identifying a Phase CA fault when: magnitudes NS1 and ZS1 are about equal and finite values, PS2 is about a finite value, and NS2 and ZS2 are about zero, and phase angle of NS1 is about 120 degrees, and phase angle of ZS1 is about −120 degrees;
 identifying a Phase DE fault when: magnitudes NS2 and ZS2 are about equal and finite values, PS1 is about a finite value, and NS1 and ZS1 are about zero, and phase angle of NS2 is about −150 degrees, and phase angle of ZS2 is about 90 degrees;

identifying a Phase EF fault when: magnitudes NS2 and ZS2 are about equal and finite values, PS1 is about a finite value, and NS1 and ZS1 are about zero, and phase angle of NS2 is about −30 degrees, and phase angle of ZS2 is about −30 degrees; or identifying a Phase DF fault when: magnitudes NS2 and ZS2 are about equal and finite values, PS1 is about a finite value, NS1 and ZS1 are about zero, and phase angle of NS2 is about 90 degrees, and phase angle of ZS2 is about −150 degrees.

2. The method of claim 1 for identifying one or more of (7) a phase CA fault where phase A is more critical than phase C, (8) a phase CA fault where phase C is more critical than phase A, (9) a phase AB fault where phase A is more critical than phase B, (10) a phase AB fault where phase B is more critical than phase A, (11) a phase BC fault where phase B is more critical than phase C, (12) a phase BC fault where phase C is more critical than phase B, (13) a phase DF fault where phase D is more critical than phase F, (14) a phase DF fault where phase F is more critical than phase D, (15) a phase DE fault where phase D is more critical than phase E, (16) a phase DE fault where phase E is more critical than phase D, (17) a phase EF fault where phase E is more critical than phase F, or (18) a phase EF fault where phase F is more critical than phase E, wherein identifying faults based upon the comparison includes:

identifying a Phase CA fault where Phase A is more critical than Phase C when: magnitudes NS1 and ZS1 are about equal and finite values, PS2 is about a finite value, and NS2 and ZS2 are about zero, and phase angle of NS1 is between about +120 and +180 degrees, and phase angle of ZS1 is between about −120 and −180 degrees;

identifying a Phase CA fault where Phase C is more critical than Phase A when: magnitudes NS1 and ZS1 are about equal and finite values, PS2 is about a finite value, and NS2 and ZS2 are about zero, and phase angle of NS1 is between about +60 and +120 degrees, and phase angle of ZS1 is between about −60 and −120 degrees;

identifying a Phase AB fault where Phase A is more critical than Phase B when: magnitudes NS1 and ZS1 are about equal and finite values, PS2 is about a finite value, and NS2 and ZS2 are about zero, and phase angle of NS1 is between about −120 and −180 degrees, and phase angle of ZS1 is between about +120 and +180 degrees;

identifying a Phase AB fault where Phase B is more critical than Phase A when: magnitudes NS1 and ZS1 are about equal and finite values, PS2 is about a finite value, and NS2 and ZS2 are about zero, and phase angle of NS1 is between about −60 and −120 degrees, and phase angle of ZS1 is between about +60 and +120 degrees;

identifying a Phase BC fault where Phase B is more critical than Phase C when: NS1 and ZS1 are about equal and finite values, PS2 is about a finite value, NS2 and ZS2 are about zero, and phase angle of NS1 is between about 0 and −60 degrees, and phase angle of ZS1 is between about 0 and +60 degrees;

identifying a Phase BC where Phase C is more critical than Phase B when: NS1 and ZS1 are about equal and finite values, PS2 is about a finite value, and NS2 and ZS2 are about zero, and phase angle of NS1 is between about 0 and 60 degrees, and phase angle of ZS1 is between about 0 to −60 degrees;

identifying a Phase DF where Phase D is more critical than Phase F when: magnitudes NS2 and ZS2 are about equal and finite values, PS1 is about a finite value, and NS1 and ZS1 are about zero, and phase angle of NS2 is between about 130 and +90 degrees, and phase angle of ZS2 is between about 160 and 180 degrees or between −180 and −150 degrees;

identifying a Phase DF fault where Phase F is more critical than Phase D when: magnitudes NS2 and ZS2 are about equal and finite values, PS1 is about a finite value, and NS1 and ZS1 are about zero, and phase angle of NS2 is between about +45 and +90 degrees, and phase angle of ZS2 is between about −100 and −160 degrees;

identifying a Phase DE fault where Phase D is more critical than Phase E when: magnitudes NS2 and ZS2 are about equal and finite values, PS1 is about a finite value, and NS1 and ZS1 are about zero, and phase angle of NS2 is between about +160 and 180 degrees, or between about −140 and −180 degrees, and phase angle of ZS2 is between about 120 to 90 degrees;

identifying a Phase DE where Phase E is more critical than Phase D, when: magnitudes NS2 and ZS2 are about equal and finite values, PS1 is about a finite value, and NS1 and ZS1 are about zero, and phase angle of NS2 is between about −150 to −110 degrees, and phase angle of ZS2 is between about +40 to +90 degrees;

identifying a Phase EF fault where Phase E is more critical than Phase F when: magnitudes NS2 and ZS2 are about equal and finite values, PS1 is about a finite value, and NS1 and ZS1 are about zero, and phase angle of NS2 is between about −30 to −80 degrees, and phase angle of ZS2 is between about −30 to 20 degrees; or identifying a Phase EF fault where Phase F is more critical than Phase E when: magnitudes NS2 and ZS2 are about equal and finite values, PS1 is about a finite value, and NS1 and ZS1 are about zero, and phase angle of NS2 is between about 20 to −30 degrees, and phase angle of ZS2 is between about −80 to −30 degrees.

3. The method of claim 2 for identifying one or more of (19) a phase A fault, (20) a phase B fault, (21) a phase C fault, (22) a phase D fault, (23) a phase E fault, or (24) a phase F fault, wherein identifying faults based upon the comparison includes:

identifying a Phase A fault when: magnitudes NS1 and ZS1 are about equal and finite values, PS2 is about a finite value, and NS2 and ZS2 are about zero, and phase angle of NS1 and ZS1 are about the same oscillating at 180 or at −180 degrees;

identifying a Phase B fault when: magnitudes NS1 and ZS1 are about equal and finite values, PS2 is about a finite value, and NS2 and ZS2 are about zero, and phase angle of NS1 is about −60 degrees, and phase phase angle of ZS1 is about 60 degrees;

identifying a Phase C fault when: magnitudes NS1 and ZS1 are about equal and finite values, PS2 is about a finite value, and NS2 and ZS2 are about zero, and phase angle of NS1 is about 60 degrees, and phase angle of ZS1 is about −60 degrees;

identifying a Phase D fault when: magnitudes NS1 and ZS2 are about equal and finite values, PS1 is about a finite value, and NS1 and ZS1 are about zero, and phase angle of NS2 is about 150 degrees, and phase angle of ZS2 is about 150 degrees;

identifying a Phase E fault when: magnitudes NS2 and ZS2 are about equal and finite values, PS1 is about a finite value, and NS1 and ZS1 are about zero, and phase angle of NS2 is about −90 degrees, and phase angle of ZS2 is about 30 degrees; or identifying a Phase F fault when: magnitudes NS2 and ZS2 are about equal and finite values, PS1 is about a finite value, and NS1 and ZS1 are about zero, and phase angle of NS2 is about 30 degrees, and phase angle of ZS2 is about −90 degrees.

4. The method of claim 1, wherein receiving parameter information includes receiving parameter information representative of one or both of current or voltage.

5. The method of claim 1 wherein identifying the fault includes identifying the fault as one or both of a motor fault or an inverter fault.

6. A method for operating a processing system to identify one or more of (1) a phase CA fault where phase A is more critical than phase C, (2) a phase CA fault where phase C is more critical than phase A, (3) a phase AB fault where phase A is more critical than phase B, (4) a phase AB fault where phase B is more critical than phase A, (5) a phase BC fault where phase B is more critical than phase C, (6) a phase BC fault where phase C is more critical than phase B, (7) a phase DF fault where phase D is more critical than phase F, (8) a phase DF fault where phase F is more critical than phase D, (9) a phase DE fault where phase D is more critical than phase E, (10) a phase DE fault where phase E is more critical than phase D, (11) a phase EF fault where phase E is more critical than phase F, or (12) a phase EF fault where phase F is more critical than phase E in an electric machine system including a multiphase machine having a plurality of sets of windings, wherein the multiphase machine includes first and second winding sets, comprising:

receiving parameter information representative of electrical operating parameters of the multiphase machine;

determining symmetrical components based on the parameter information, including determining:
- a positive sequence value PS1, negative sequence value NS1 and zero sequence value ZS1 for the first winding set; and
- a positive sequence value PS2, negative sequence value NS2 and zero sequence value ZS3 for the second winding set; and comparing the symmetrical components PS1, NS1, ZS1, PS2, NS2, ZS2 to fault information defining the faults with respect to predetermined symmetrical component fault values; and identifying faults based on the comparison, including:
- identifying a Phase CA fault where Phase A is more critical than Phase C when: magnitudes NS1 and ZS1 are about equal and finite values, PS2 is about a finite value, and NS2 and ZS2 are about zero, and phase angle of NS1 is between about +120 and +180 degrees, and phase angle of ZS1 is between about −120 and −180 degrees;
- identifying a Phase CA fault where Phase C is more critical than Phase A when: magnitudes NS1 and ZS1 are about equal and finite values, PS2 is about a finite value, and NS2 and ZS2 are about zero, and phase angle of NS1 is between about +60 and +120 degrees, and phase angle of ZS1 is between about −60 and −120 degrees;
- identifying a Phase AB fault where Phase A is more critical than Phase B when: magnitudes NS1 and ZS1 are about equal and finite values, PS2 is about a finite value, and NS2 and ZS2 are about zero, and phase angle of NS1 is between about −120 and −180 degrees, and phase angle of ZS1 is between about +120 and +180 degrees;
- identifying a Phase AB fault where Phase B is more critical than Phase A when: magnitudes NS1 and ZS1 are about equal and finite values, PS2 is about a finite value, and NS2 and ZS2 are about zero, and phase angle of NS1 is between about −60 and −120 degrees, and phase angle of ZS1 is between about +60 and +120 degrees;
- identifying a Phase BC fault where Phase B is more critical than Phase C when: NS1 and ZS1 are about equal and finite values, PS2 is about a finite value, NS2 and ZS2 are about zero, and phase angle of NS1 is between about 0 and −60 degrees, and phase angle of ZS1 is between about 0 and +60 degrees;
- identifying a Phase BC where Phase C is more critical than Phase B when: NS1 and ZS1 are about equal and finite values, PS2 is about a finite value, and NS2 and ZS2 are about zero, and phase angle of NS1 is between about 0 and 60 degrees, and phase angle of ZS1 is between about 0 to −60 degrees;
- identifying a Phase DF where Phase D is more critical than Phase F when: magnitudes NS2 and ZS2 are about equal and finite values, PS1 is about a finite value, and NS1 and ZS1 are about zero, and phase angle of NS2 is between about 130 and +90 degrees, and phase angle of ZS2 is between about 160 and 180 degrees or between −180 and −150 degrees;
- identifying a Phase DF fault where Phase F is more critical than Phase D when: magnitudes NS2 and ZS2 are about equal and finite values, PS1 is about a finite value, and NS1 and ZS1 are about zero, and phase angle of NS2 is between about +45 and +90 degrees, and phase angle of ZS2 is between about −100 and −160 degrees;
- identifying a Phase DE fault where Phase D is more critical than Phase E when: magnitudes NS2 and ZS2 are about equal and finite values, PS1 is about a finite value, and NS1 and ZS1 are about zero, and phase angle of NS2 is between about +160 and 180 degrees, or between about −140 and −180 degrees, and phase angle of ZS2 is between about 120 to 90 degrees;
- identifying a Phase DE where Phase E is more critical than Phase D, when: magnitudes NS2 and ZS2 are about equal and finite values, PS1 is about a finite value, and NS1 and ZS1 are about zero, and phase angle of NS2 is between about −150 to −110 degrees, and phase angle of ZS2 is between about +40 to +90 degrees;
- identifying a Phase EF fault where Phase E is more critical than Phase F when: magnitudes NS2 and ZS2 are about equal and finite values, PS1 is about a finite value, and NS1 and ZS1 are about zero, and phase angle of NS2 is between about −30 to −80 degrees, and phase angle of ZS2 is between about −30 to 20 degrees; or
- identifying a Phase EF fault where Phase F is more critical than Phase E when: magnitudes NS2 and ZS2 are about equal and finite values, PS1 is about a finite value, and NS1 and ZS1 are about zero, and phase angle of NS2 is between about 20 to −30 degrees, and phase angle of ZS2 is between about −80 to −30 degrees.

7. The method of claim 6 wherein receiving parameter information includes receiving parameter information representative of one or both of current or voltage.

8. The method of claim 6 wherein identifying the fault includes identifying the fault as one of a motor fault or an inverter fault.

9. A computer system including one or more processors and memory storing instructions, the computer system configured to identify one or more of (1) a phase AB fault, (2) a phase BC fault, (3) a phase CA fault, (4) a phase DE fault, (5) a phase EF fault, or (6) a phase DF fault in an electric machine system including a multiphase machine having a plurality of sets of windings, wherein the multiphase machine includes first and second winding sets, and wherein the instructions, when executed by the one or more processors, cause the one or more processors to:
  receive parameter information representative of electrical operating parameters of the multiphase machine;
  determine symmetrical components based on the parameter information, including determining:
    a positive sequence value PS1, negative sequence value NS1 and zero sequence value ZS1 for the first winding set; and
    a positive sequence value PS2, negative sequence value NS2 and zero sequence value ZS3 for the second winding set; and
  compare the symmetrical components PS1, NS1, ZS1, PS2, NS2, ZS2 to fault information defining the faults with respect to predetermined symmetrical component fault values; and
  identify faults based on the comparison, including:
    identifying a Phase AB fault when: magnitudes NS1 and ZS1 are about equal and finite values, PS2 is about a finite value, and NS2 and ZS2 are about zero, and phase angle of NS1 is about −120 degrees, and phase angle of ZS1 is about 120 degrees;
    identifying a Phase BC fault when: magnitudes NS1 and ZS1 are about equal and finite values, PS2 is about a finite value, and NS2 and ZS2 are about zero, and phase angle of NS1 is about 0 degrees, and phase angle of ZS1 is about 0 degrees;
    identifying a Phase CA fault when: magnitudes NS1 and ZS1 are about equal and finite values, PS2 is about a finite value, and NS2 and ZS2 are about zero, and phase angle of NS1 is about 120 degrees, and phase angle of ZS1 is about −120 degrees;
    identifying a Phase DE fault when: magnitudes NS2 and ZS2 are about equal and finite values, PS1 is about a finite value, and NS1 and ZS1 are about zero, and phase angle of NS2 is about −150 degrees, and phase angle of ZS2 is about 90 degrees;
    identifying a Phase EF fault when: magnitudes NS2 and ZS2 are about equal and finite values, PS1 is about a finite value, and NS1 and ZS1 are about zero, and phase angle of NS2 is about −30 degrees, and phase angle of ZS2 is about −30 degrees; or
    identifying a Phase DF fault when: magnitudes NS2 and ZS2 are about equal and finite values, PS1 is about a finite value, NS1 and ZS1 are about zero, and phase angle of NS2 is about 90 degrees, and phase angle of ZS2 is about −150 degrees.

10. The computer system of claim 9, wherein the computer system is further configured to identify one or more of (7) a phase CA fault where phase A is more critical than phase C, (8) a phase CA fault where phase C is more critical than phase A, (9) a phase AB fault where phase A is more critical than phase B, (10) a phase AB fault where phase B is more critical than phase A, (11) a phase BC fault where phase B is more critical than phase C, (12) a phase BC fault where phase C is more critical than phase B, (13) a phase DF fault where phase D is more critical than phase F, (14) a phase DF fault where phase F is more critical than phase D, (15) a phase DE fault where phase D is more critical than phase E, (16) a phase DE fault where phase E is more critical than phase D, (17) a phase EF fault where phase E is more critical than phase F, or (18) a phase EF fault where phase F is more critical than phase E, and the instructions, when executed by the one or more processors, cause the one or more processors to:
  identify a Phase CA fault where Phase A is more critical than Phase C when: magnitudes NS1 and ZS1 are about equal and finite values, PS2 is about a finite value, and NS2 and ZS2 are about zero, and phase angle of NS1 is between about +120 and +180 degrees, and phase angle of ZS1 is between about −120 and −180 degrees;
  identify a Phase CA fault where Phase C is more critical than Phase A when: magnitudes NS1 and ZS1 are about equal and finite values, PS2 is about a finite value, and NS2 and ZS2 are about zero, and phase angle of NS1 is between about +60 and +120 degrees, and phase angle of ZS1 is between about −60 and −120 degrees;
  identify a Phase AB fault where Phase A is more critical than Phase B when: magnitudes NS1 and ZS1 are about equal and finite values, PS2 is about a finite value, and NS2 and ZS2 are about zero, and phase angle of NS1 is between about −120 and −180 degrees, and phase angle of ZS1 is between about +120 and +180 degrees;
  identify a Phase AB fault where Phase B is more critical than Phase A when: magnitudes NS1 and ZS1 are about equal and finite values, PS2 is about a finite value, and NS2 and ZS2 are about zero, and phase angle of NS1 is between about −60 and −120 degrees, and phase angle of ZS1 is between about +60 and +120 degrees;
  identify a Phase BC fault where Phase B is more critical than Phase C when: NS1 and ZS1 are about equal and finite values, PS2 is about a finite value, NS2 and ZS2 are about zero, and phase angle of NS1 is between about 0 and −60 degrees, and phase angle of ZS1 is between about 0 and +60 degrees;
  identify a Phase BC where Phase C is more critical than Phase B when: NS1 and ZS1 are about equal and finite values, PS2 is about a finite value, and NS2 and ZS2 are about zero, and phase angle of NS1 is between about 0 and 60 degrees, and phase angle of ZS1 is between about 0 to −60 degrees;
  identify a Phase DF where Phase D is more critical than Phase F when: magnitudes NS2 and ZS2 are about equal and finite values, PS1 is about a finite value, and NS1 and ZS1 are about zero, and phase angle of NS2 is between about 130 and +90 degrees, and phase angle of ZS2 is between about 160 and 180 degrees or between −180 and −150 degrees;
  identify a Phase DF fault where Phase F is more critical than Phase D when: magnitudes NS2 and ZS2 are about equal and finite values, PS1 is about a finite value, and NS1 and ZS1 are about zero, and phase angle of NS2 is between about +45 and +90 degrees, and phase angle of ZS2 is between about −100 and −160 degrees;
  identify a Phase DE fault where Phase D is more critical than Phase E when: magnitudes NS2 and ZS2 are about equal and finite values, PS1 is about a finite value, and NS1 and ZS1 are about zero, and phase angle of NS2 is between about +160 and 180 degrees, or between about −140 and −180 degrees, and phase angle of ZS2 is between about 120 to 90 degrees;

identify a Phase DE where Phase E is more critical than Phase D, when: magnitudes NS2 and ZS2 are about equal and finite values, PS1 is about a finite value, and NS1 and ZS1 are about zero, and phase angle of NS2 is between about −150 to −110 degrees, and phase angle of ZS2 is between about +40 to +90 degrees;

identify a Phase EF fault where Phase E is more critical than Phase F when: magnitudes NS2 and ZS2 are about equal and finite values, PS1 is about a finite value, and NS1 and ZS1 are about zero, and phase angle of NS2 is between about −30 to −80 degrees, and phase angle of ZS2 is between about −30 to 20 degrees; or identify a Phase EF fault where Phase F is more critical than Phase E when: magnitudes NS2 and ZS2 are about equal and finite values, PS1 is about a finite value, and NS1 and ZS1 are about zero, and phase angle of NS2 is between about 20 to −30 degrees, and phase angle of ZS2 is between about −80 to −30 degrees.

11. The computer system of claim 9, wherein the parameter information includes parameter information representative of one or both of current or voltage.

12. The computer system of claim 9 wherein the fault includes one or both of a motor fault or an inverter fault.

* * * * *